(12) United States Patent
Mendoza et al.

(10) Patent No.: US 11,139,131 B2
(45) Date of Patent: Oct. 5, 2021

(54) ELECTROMECHANICAL RELAY WITH DATA COLLECTION COVER

(71) Applicant: ABB Schweiz AG, Baden (CH)

(72) Inventors: Malbin Jose Mendoza, Weston, FL (US); Prerak N. Shah, Coral Springs, FL (US); Todd Gentile, Tamarac, FL (US); Richard Lindo, Lauderhill, FL (US)

(73) Assignee: ABB Schweiz AG, Baden (CH)

( * ) Notice: Subject to any disclaimer, the term of this patent is extended or adjusted under 35 U.S.C. 154(b) by 293 days.

(21) Appl. No.: 16/230,170

(22) Filed: Dec. 21, 2018

(65) Prior Publication Data

US 2020/0203103 A1   Jun. 25, 2020

(51) Int. Cl.

| G01R 13/32 | (2006.01) |
|---|---|
| H01H 50/02 | (2006.01) |
| H01H 50/10 | (2006.01) |
| G01R 31/327 | (2006.01) |
| G01R 15/20 | (2006.01) |
| H01H 71/46 | (2006.01) |
| H03M 1/12 | (2006.01) |

(52) U.S. Cl.
CPC ......... *H01H 50/021* (2013.01); *G01R 15/202* (2013.01); *G01R 31/3274* (2013.01); *H01H 50/10* (2013.01); *H01H 71/46* (2013.01); *H03M 1/12* (2013.01)

(58) Field of Classification Search
CPC .............. G01R 15/202; G01R 31/3274; H01H 50/021; H01H 50/10; H01H 71/46; H03M 1/12

USPC ...... 324/415, 416, 418, 419, 424; 361/1, 78, 361/79, 80, 93.1, 94, 99, 139, 157, 160, 361/166, 183, 184, 191, 206, 626, 819; 340/644, 3.1, 3.22, 3.23, 3.8

See application file for complete search history.

(56) References Cited

U.S. PATENT DOCUMENTS

| 4,652,867 | A | 3/1987 | Masot |
| 4,987,395 | A | 1/1991 | Ozaki et al. |
| 5,877,691 | A | 3/1999 | Suptitz et al. |
| 6,943,652 | B2 | 9/2005 | Rodriguez et al. |
| 7,414,411 | B2 | 8/2008 | Tan et al. |
| 8,018,703 | B2 | 9/2011 | Chelloug |
| 8,643,501 | B2 | 2/2014 | Sisley et al. |
| 2010/0001820 | A1* | 1/2010 | Fancke ................. H01H 50/08 335/202 |
| 2010/0207712 | A1 | 8/2010 | Braune et al. |
| 2011/0254557 | A1* | 10/2011 | Makki ................ G01R 31/3274 324/418 |
| 2013/0120090 | A1 | 5/2013 | Ball |
| 2015/0377934 | A1 | 12/2015 | Choe et al. |
| 2016/0033578 | A1* | 2/2016 | Wolfe ................ G01R 31/3278 324/754.03 |

(Continued)

*Primary Examiner* — Melissa J Koval
*Assistant Examiner* — Courtney G McDonnough
(74) *Attorney, Agent, or Firm* — Greenberg Traurig, LLP

(57) ABSTRACT

An electromechanical relay is provided with a housing, a relay assembly within the housing, and a data collection cover enclosing the relay assembly within the housing. The data collection cover includes sensing members that extend in toward the relay assembly and engage disconnect switches of the relay assembly. The sensing members transmit analog signals to an analog-to-digital converter that converts analog signals to digital signals. The cover then stores, displays and/or communicates the digital information.

19 Claims, 15 Drawing Sheets

(56) References Cited

U.S. PATENT DOCUMENTS

2016/0260569 A1    9/2016  Mishra et al.
2018/0033566 A1*   2/2018  Mendoza ............ H01H 1/0015

* cited by examiner

ELECTROMECHANICAL RELAY WITH DATA COLLECTION COVER

BACKGROUND

The present inventions relate generally to electromechanical relays, and more particularly, to a cover for an electromechanical relays.

Electromechanical relays are commonly used to disconnect a circuit or apparatus when the current, voltage or other electrical property is outside of a predetermined range. For example, one electromechanical relay that has been used for many years in a variety of applications is the Type CO relay made by ABB Group. An advantage of electromechanical relays is that they are very reliable and can operate in the field for many years before needing to be tested or replaced. As a result, there are many electromechanical relays currently in the field with sufficient functionality that complete replacement of such relays is unjustified. However, a disadvantage of many electromechanical relays in the field is that they provide minimal or no data that can be analyzed to better understand and control electrical power in the circuit, apparatus or relay. For example, many electromechanical relays currently in the field were manufactured and installed before the incorporation of microprocessors and other electronics into such equipment was common. Accordingly, it would be desirable to be able to retrofit electromechanical relays that are already installed in the field with data collection capabilities without needing to replace the electromechanical relay itself.

SUMMARY

A data collection cover is described that may be retrofitted onto conventional electromechanical relays to provide data collection capabilities to the relay without needing to replace, rewire or otherwise modify the relay. Thus, existing relays operating in the field can be easily updated with additional monitoring functionality without the expense and difficulty of completely replacing relays. The data collection cover provides sensing members that engage disconnect switches of the relay. The data collection cover also provides an analog-to-digital converter to convert analog signals from the sensing members to digital signals that may be stored in the data collection cover, displayed by the cover, or communicated to other devices by the cover.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
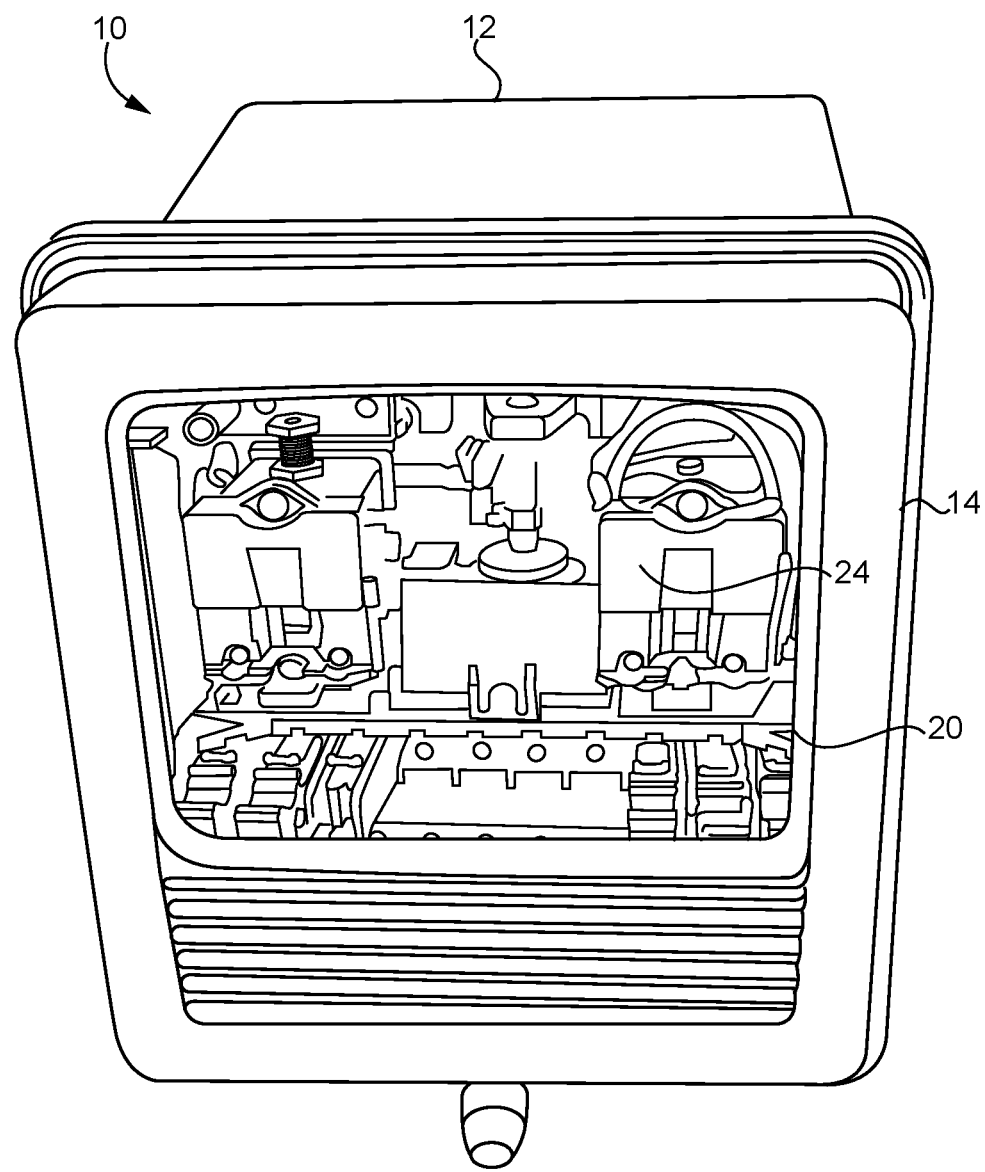
FIG. 1 is a front view of an electromechanical relay with a conventional cover.
Figure 2:
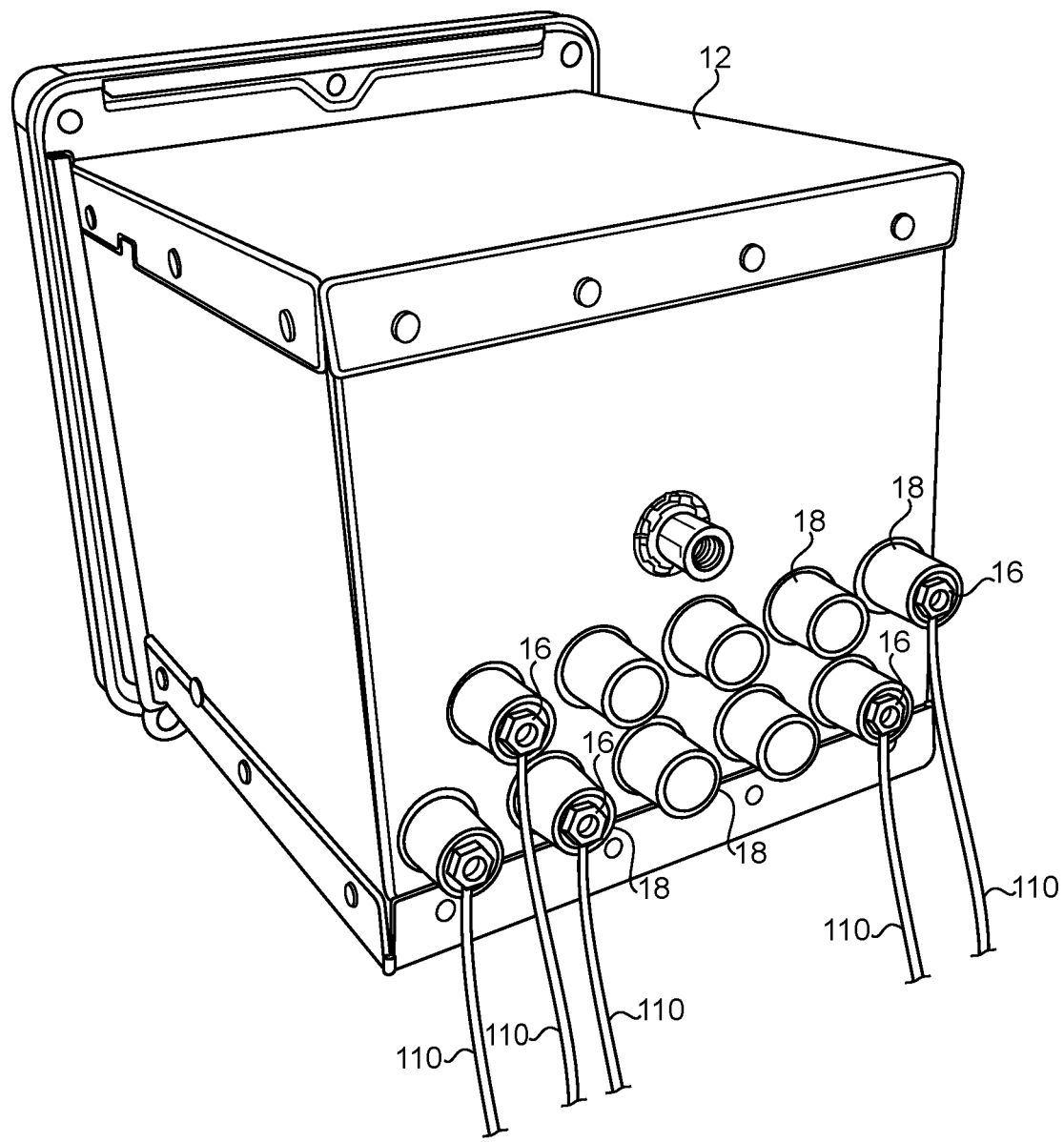
FIG. 2 is a rear view of the electromechanical relay.
Figure 3:
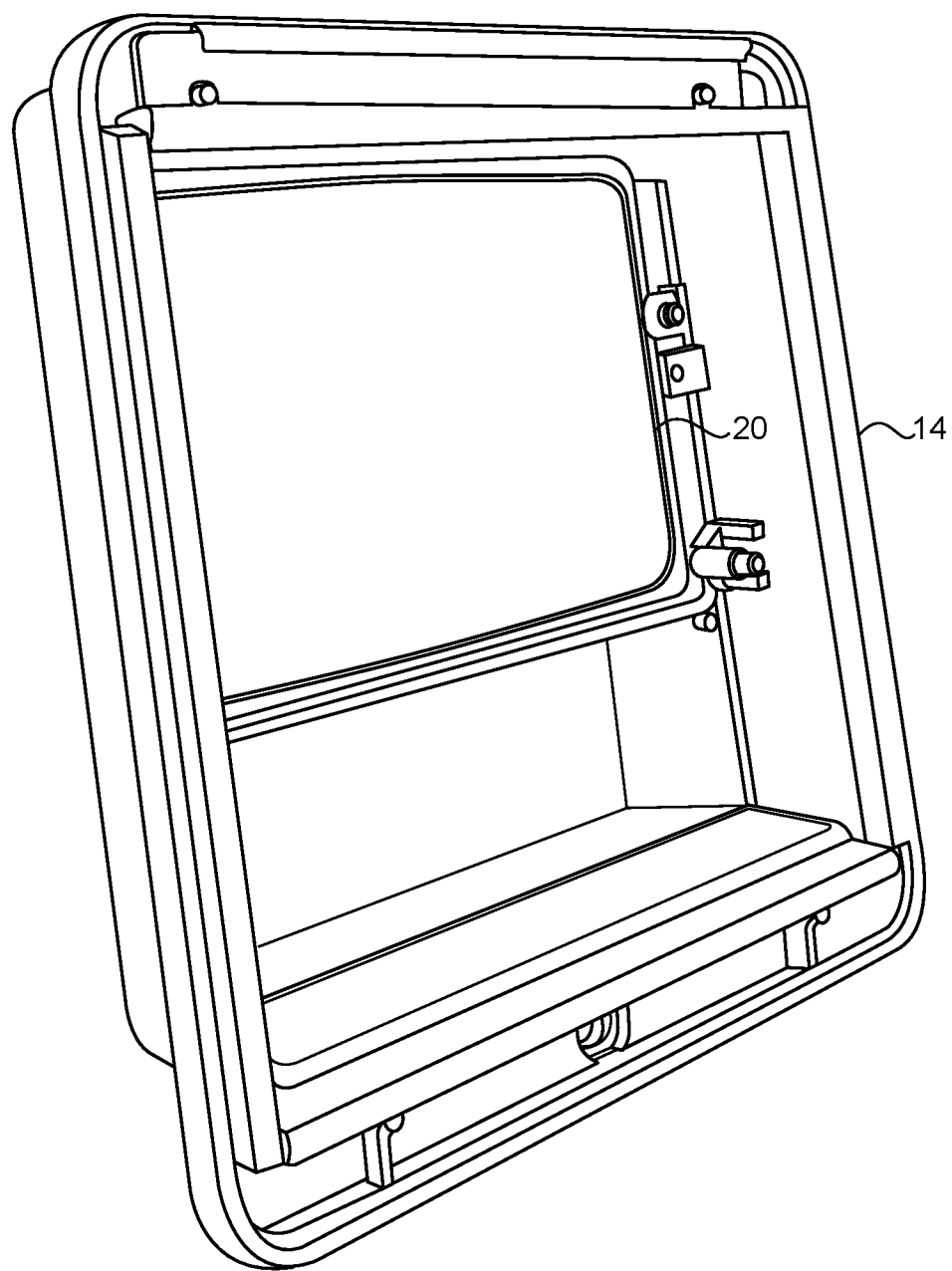
FIG. 3 is a rear view of a cover for the electromechanical relay.

An electromechanical relay 10 is shown in FIG. 1. As shown, the electromechanical relay 10 has a housing 12 and a front cover 14. The electromechanical relay 10 is representative of electromechanical relays that may be currently installed and operating in the field to disconnect a circuit or apparatus when an electrical property, such as current or voltage, is outside of a predetermined range. An example of the housing 12 is the Type FT relay case made by ABB Group. The rear side of the housing 12 is shown in FIG. 2. As shown, a number of electrical terminals 16 may be provided to connect the electromechanical relay 10 to electrical conductors 110 of a circuit or apparatus. Since the housing 12 may be used with a variety of relay assemblies which are connected to a variety of circuits or apparatuses, it is possible that some of the terminal ports 18 in the housing 12 may not be provided with electrical terminals 16 in some cases. A rear view of the front cover 14 is shown in FIG. 3. As shown, the front cover 14 provides a window 20 covered by a transparent material to allow the operator to view the inside of the housing 12, for example to see if the relay assembly 24 has tripped. Otherwise, the cover 14 only encloses the front of the housing 12 without providing any additional capabilities to the electromechanical relay 10.

Figure 4:
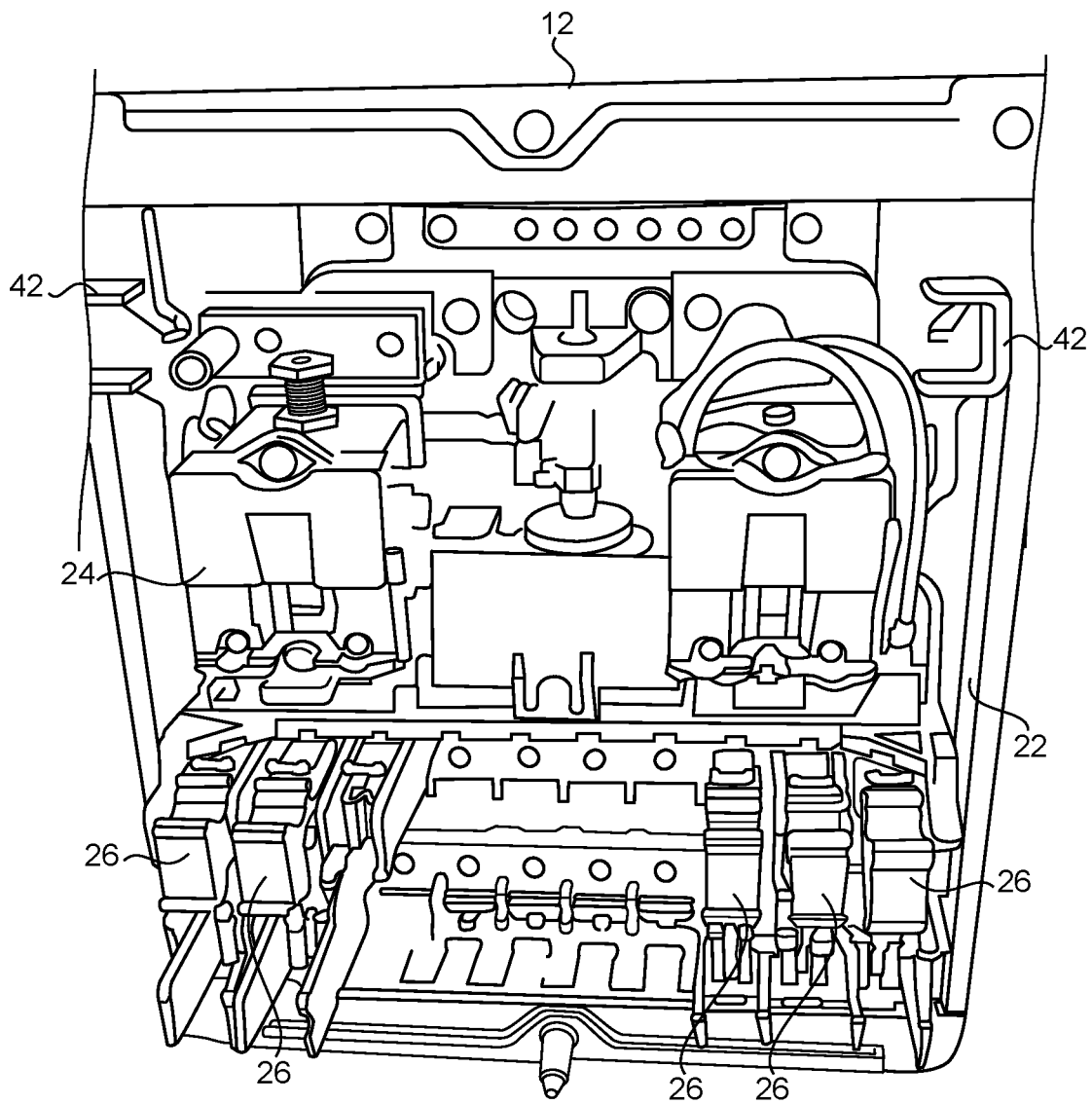
FIG. 4 is a front view of a relay assembly within the housing of the electromechanical relay with the cover removed.
Figure 5:
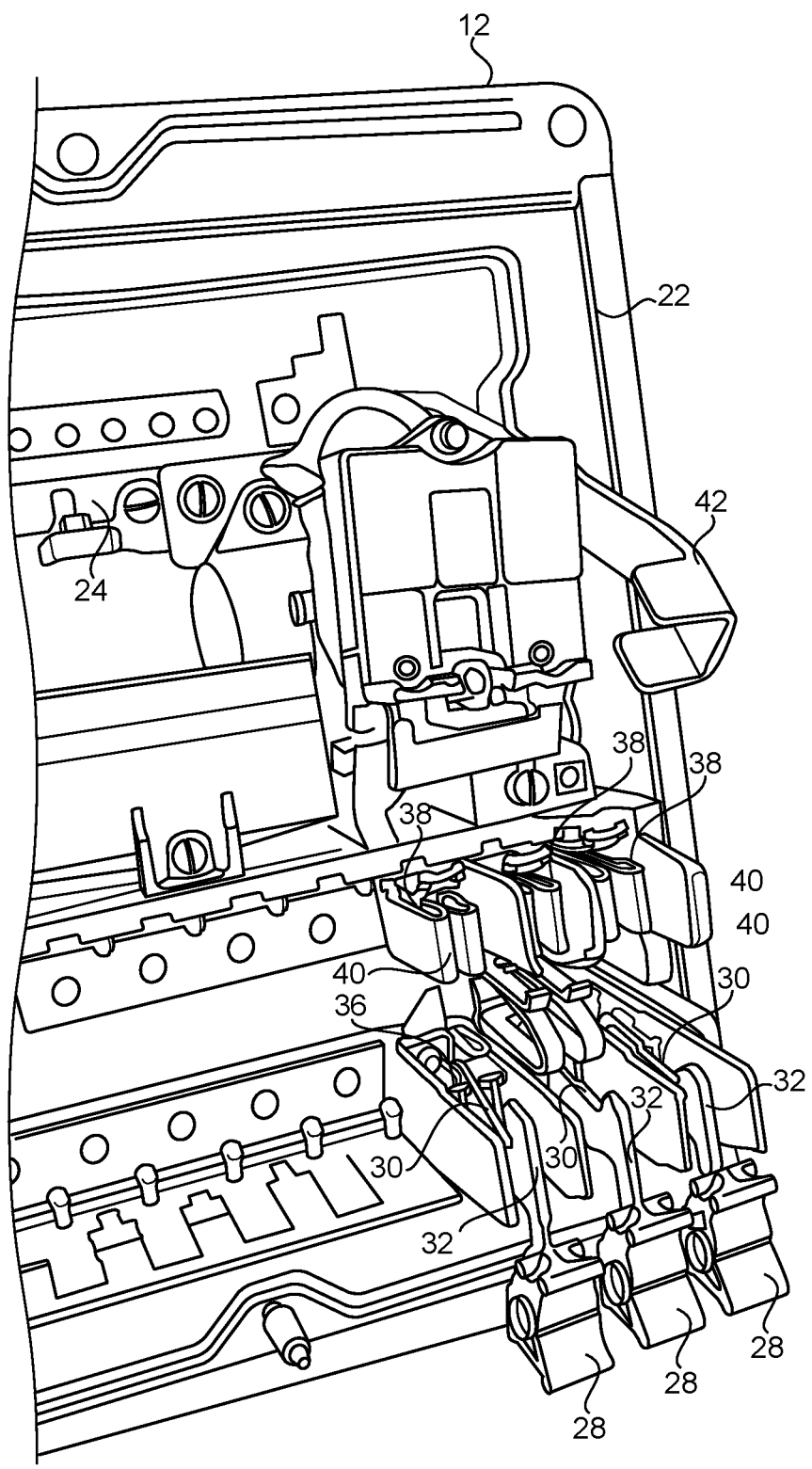
FIG. 5 is a front view of a portion of the relay assembly within the housing, showing the disconnect switches opened.

The electromechanical relay 10 is shown in FIG. 4 without the front cover 14 installed on the housing 12. As shown, the housing 12 has a front opening 22 that is enclosed by the cover 14 when the cover 14 is installed (as shown in FIG. 1). Within the housing 12 is a relay assembly 24. An example of the relay assembly 24 is a Type CO relay made by ABB Group. The electrical connections (which in the preferred embodiment are the stationary contacts 38) of the relay assembly 24 are electrically connected to the electrical terminal 16 of the housing 12 with a number of disconnect switches 26 (e.g., knife switches). The disconnect switches 26 are shown closed in FIG. 4 to electrically connect the relay assembly 24. As shown in FIG. 5, the disconnect switches 26 may be opened to electrically disconnect the relay assembly 24 from the electrical terminals 16 of the housing 12.

Figure 10A:
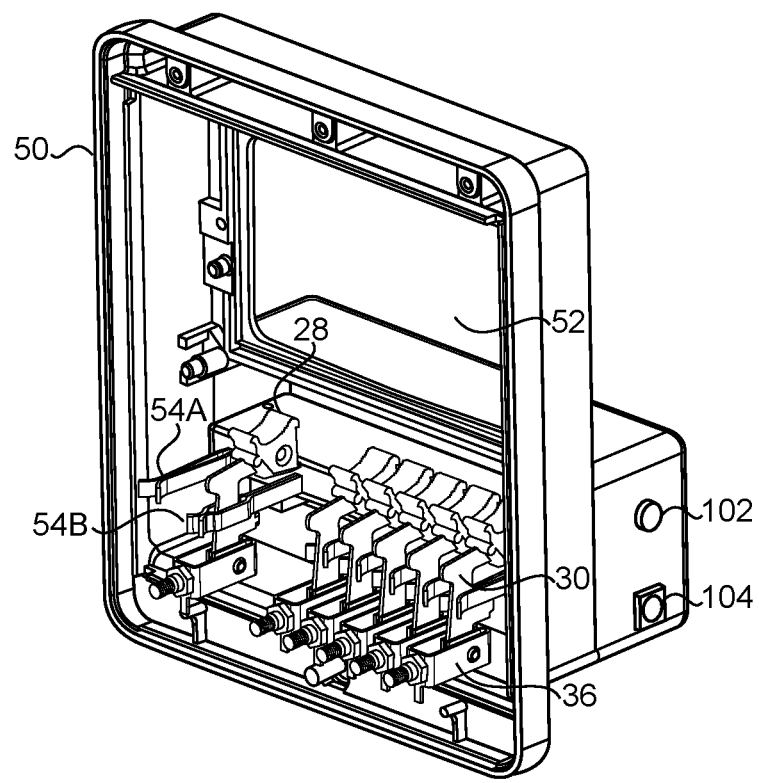
FIGS. 10A-10B are rear views of the cover, showing the disconnect switches engaged with the sensing members.
Figure 10B:
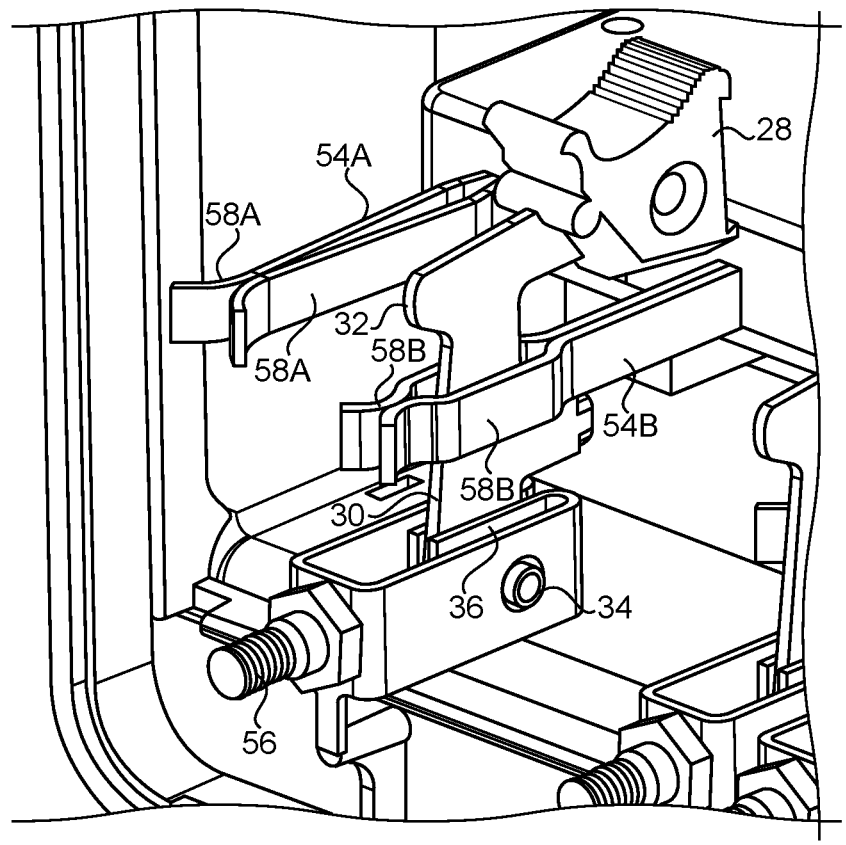

The disconnect switches 26 are preferably manual switches that are opened and closed by hand by the operator. Thus, an insulated knob 28 may be provided at the top of the movable contact 30 to grasp the movable contact 30 of the disconnect switch 26 (see, e.g., FIG. 5). The movable contact 30 may include a blade 32 that is rotatably attached to the housing 12 around a pivot pin 34 (see, e.g., FIG. 10B). The housing 12 may also be provided with spring contacts 36 at the pin 34 connection to squeeze the sides of the blade 32 to provide good electrical contact therebetween. In order to close the disconnect switch 26 and electrically connect the relay assembly 24, the movable contact 30 (blade 32) may be rotated upward so that the movable contact 30 touches the stationary contact 38 of the relay assembly 24. The stationary contact 38 may be spring contacts 40 (e.g., jaws) that the blade 32 is slid between when rotated upward.

Figures 6A, 6B:
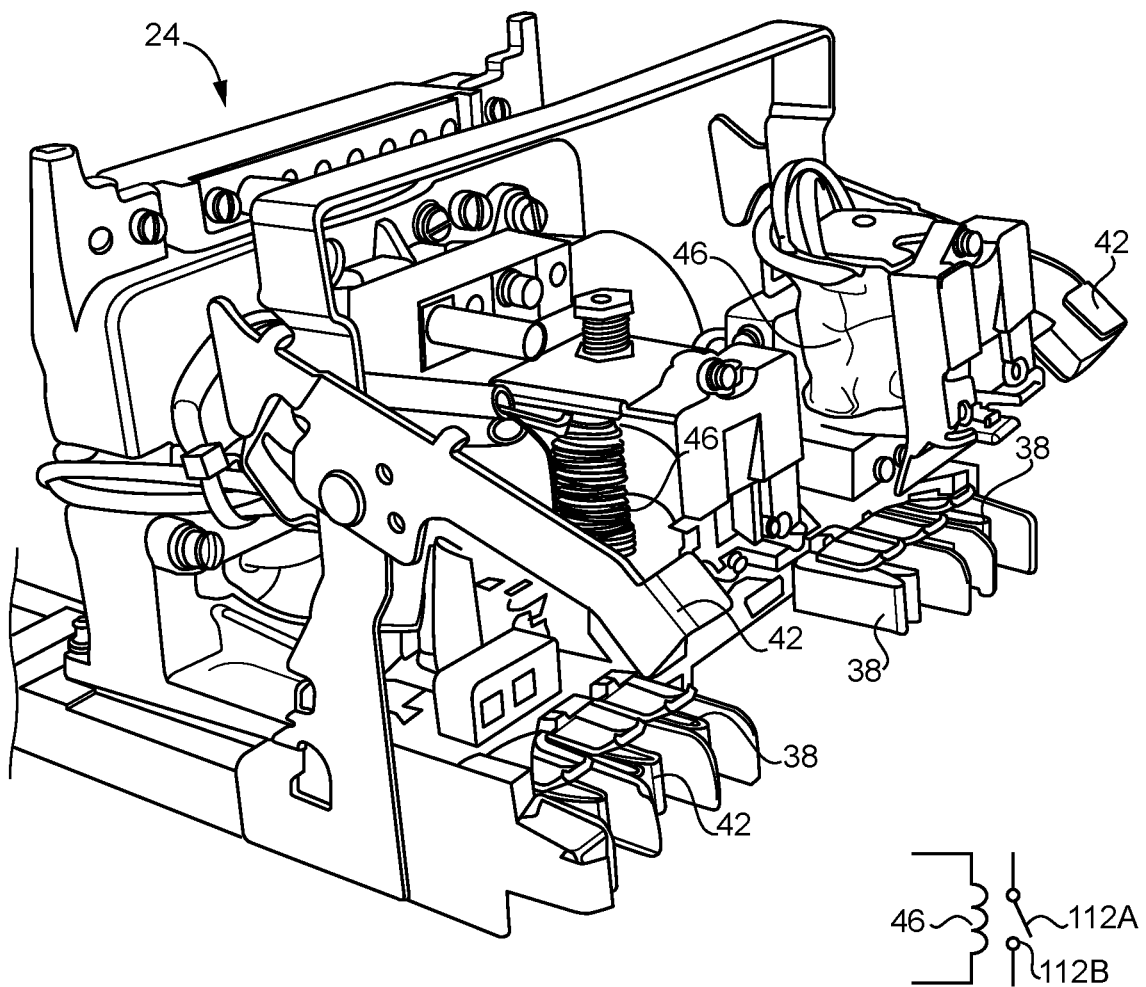
FIG. 6A is a perspective view of the relay assembly removed from the housing.
FIG. 6B is a schematic view of a conventional electromechanical coil which actuates a pair of electrical contacts.
Figure 7:
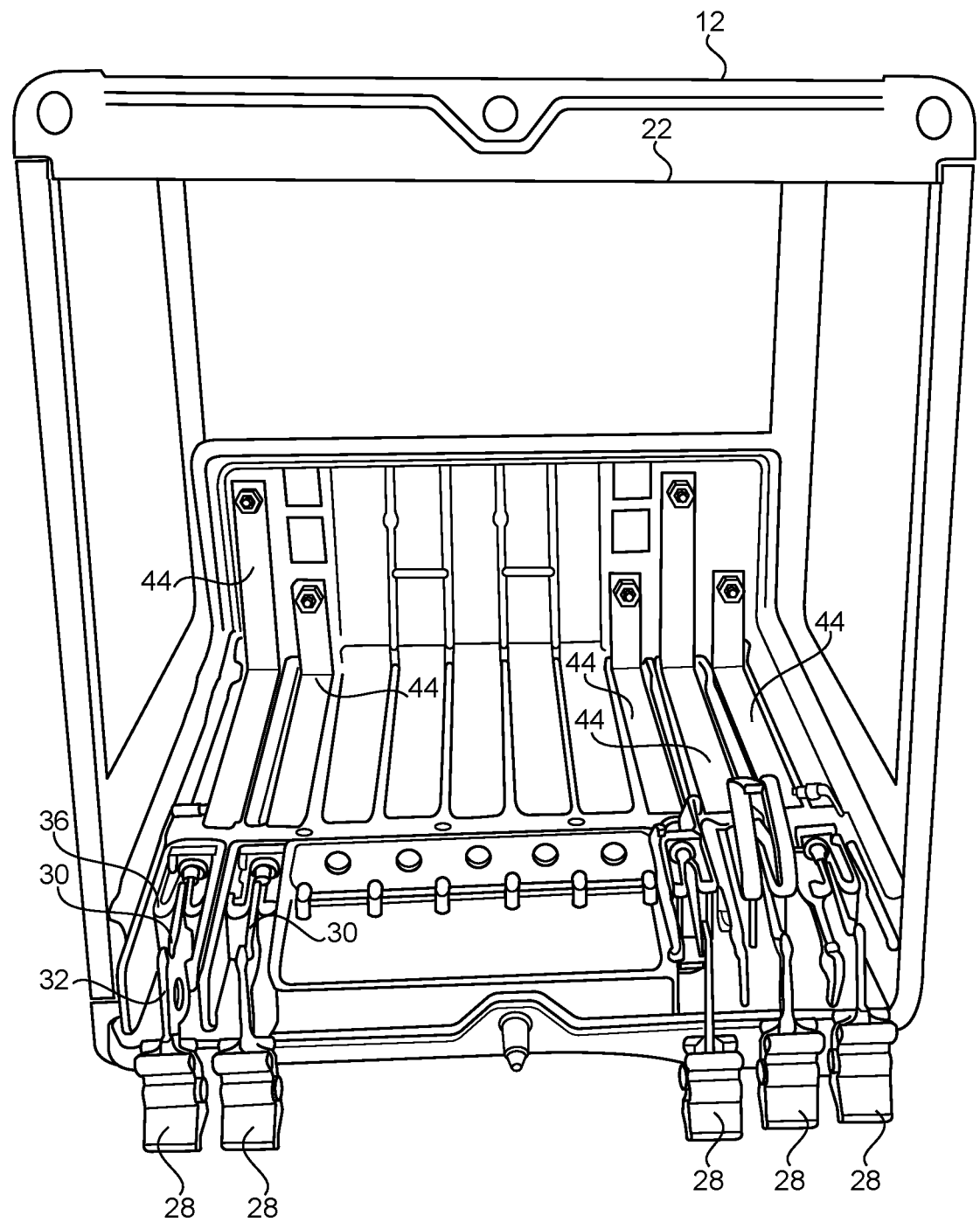
FIG. 7 is a front view of the housing with the relay assembly removed therefrom.

As shown in FIGS. 6A-7, the relay assembly 24 may be removed from the housing 12 for testing and/or replacement. Locking handles 42 may be provided to mechanically lock the relay assembly 24 within the housing 12 and release the relay assembly 24 therefrom. As shown in FIG. 5, the locking handles 42 have been pulled down to release the relay assembly 24. The relay assembly 24 may then be slid out of the housing 12 through the front opening 22 to remove the relay assembly 24. As shown in FIG. 7, the housing 12 may be provided with internal conductors 44 that electrically connect the rear terminals 16 to the movable contacts 30 at the front opening 22. Unlike a solid-state relay, the relay assembly 24 of an electromechanical relay 10 includes an electromagnetic coil 46 that connects and/or disconnects a pair of electrical contacts 112A, 112B when energized as shown in the schematic of FIG. 6B. The relay assembly 24 preferably senses electrical anomalies and actuates the electromagnetic coil 46 without the use of any microprocessors.

Figure 8A:
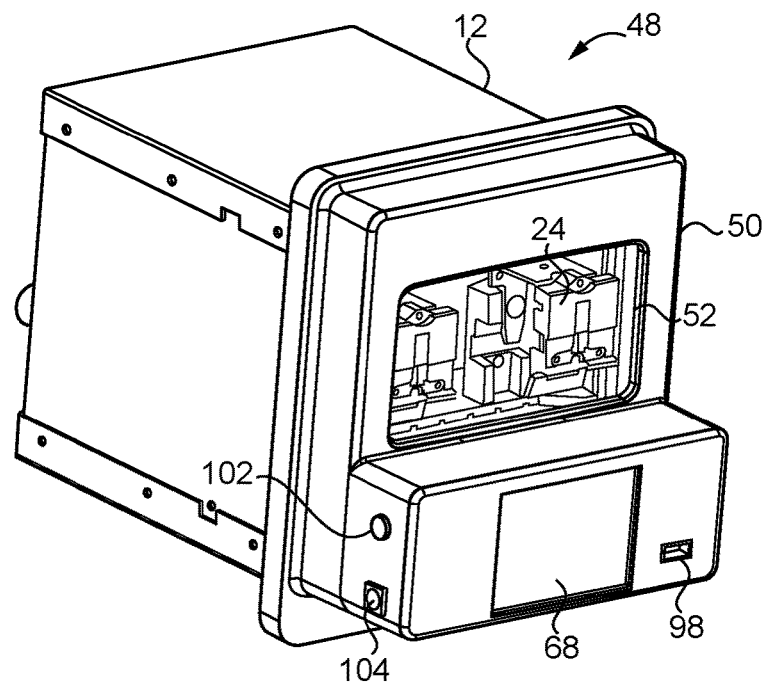
FIGS. 8A-8B are perspective views of an improved electromechanical relay with a data collection cover.
Figure 8B:
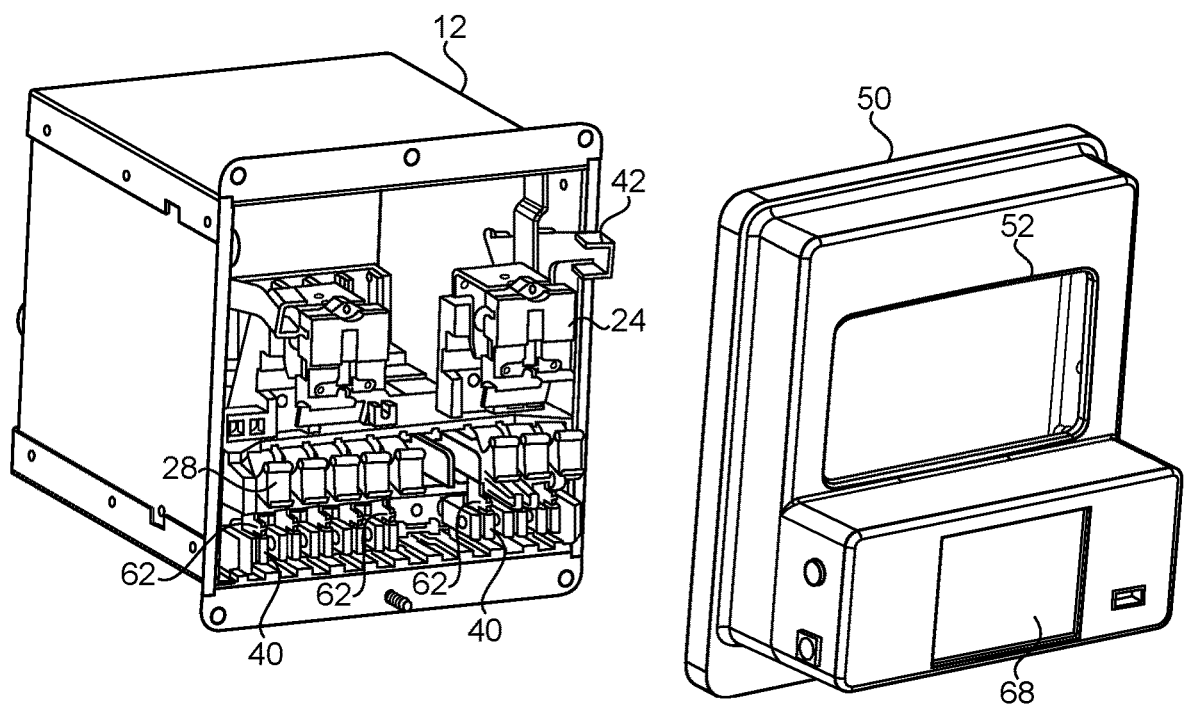

An improved electromechanical relay 48 is shown in FIGS. 8A-8B. Unlike the electromechanical relay 10 of FIG. 1, the electromechanical relay 48 of FIGS. 8A-8B has a data collection cover 50. The data collection cover 50 may be a direct replacement for the cover 14 of FIGS. 1 and 3 so that electromechanical relays 10 in the field may be retrofitted to add data collection capabilities. Thus, as shown, the cover 50 encloses the front opening 22 of the housing 12, and the relay assembly 24 therein, in a similar manner as the cover 14 of FIGS. 1 and 3. Like the conventional cover 14, it may also be desirable to provide the data collection cover 50 with a window 52 to view the relay assembly 24 inside of the housing 12.

Figure 9A:
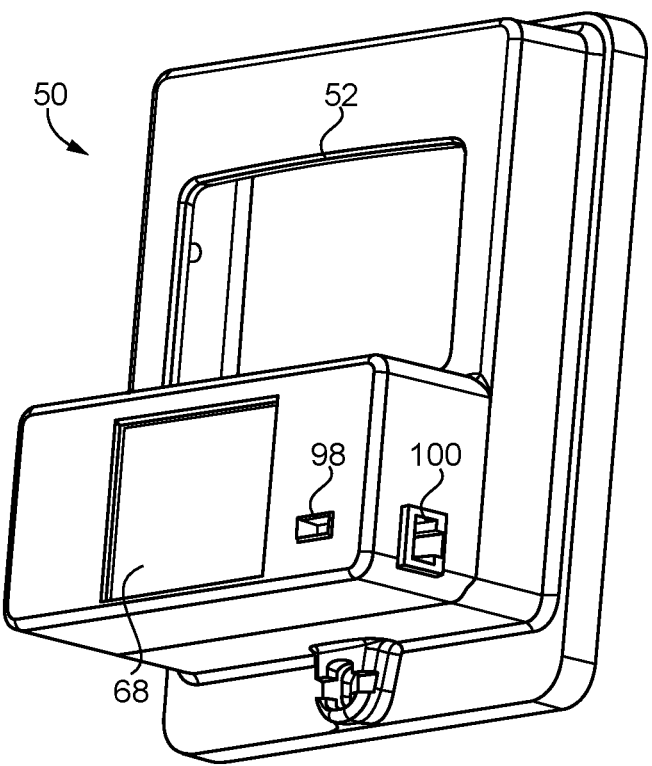
FIGS. 9A-9B are perspective views of the data collection cover.
Figure 9B:
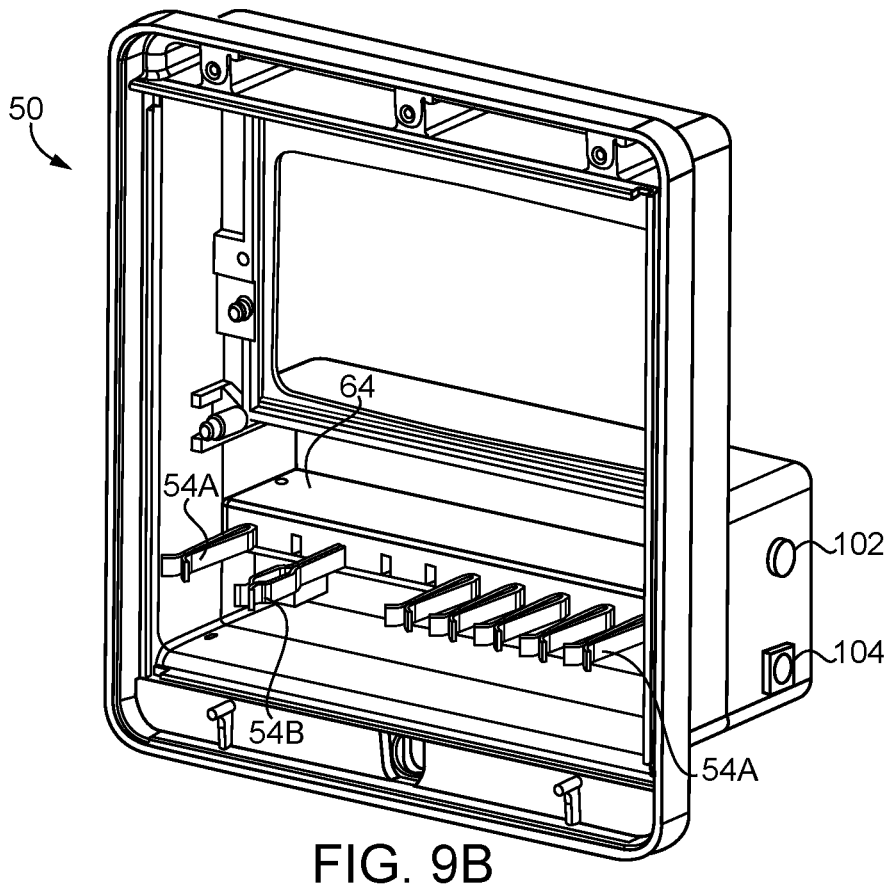

As shown in FIG. 9B, the back side of the data collection cover 50 is provided with a number of sensing members 54 that extend in toward the opening 22 of the housing 12. In FIGS. 10A-11B, the disconnect switches 26 of the housing 12 are shown separated from the housing 12 and engaged with the sensing members 54 for illustration purposes only. That is, as shown in FIG. 7, the disconnect switches 26 are normally connected to the housing 12 with the screw 56 being threaded into the housing 12. Therefore, in the embodiments shown herein, the disconnect switches 26 are considered to be a part of the housing 12 and not the data collection cover 50. FIGS. 10A-11B are intended to show how the sensing members 54 engage the disconnect switches 26 when the data collection cover 50 is connected to the housing 12, which would be difficult to illustrate without separating the disconnect switches 26 from the housing 12. Thus, as shown, when the data collection cover 50 is connected to the housing 12, and the disconnect switches 26 are closed therein to electrically connect the relay assembly 24, each sensing member 54 engages one of the closed disconnect switches 26. When it is desired to access the relay assembly 24 in the housing 12, the data collection cover 50 may be removed from the housing 12 like a conventional cover 14 and the sensing members 54 disengage from the disconnect switches 26 without operator intervention.

Figure 11A:
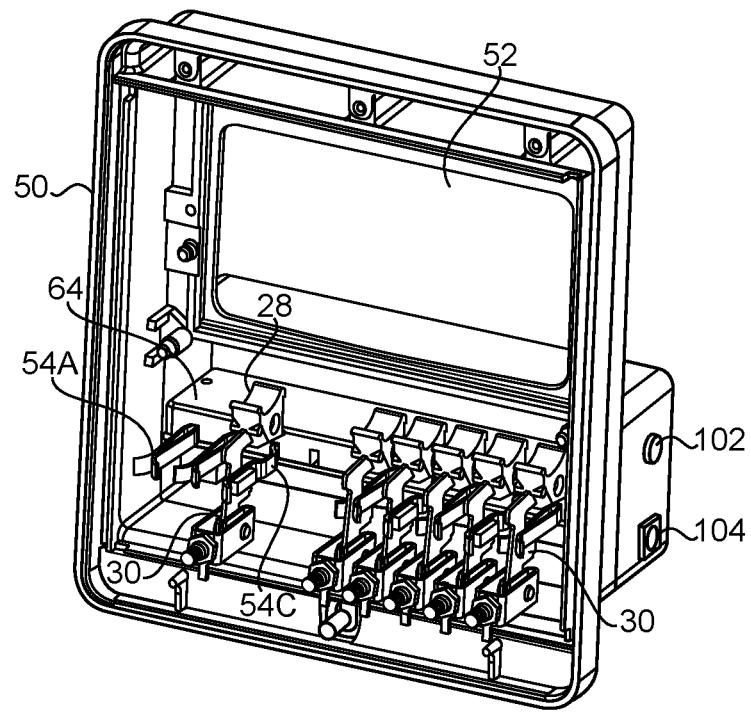
FIGS. 11A-11B are rear views of the cover, showing an alternative sensing member engaged with the disconnect switches.
Figure 11B:
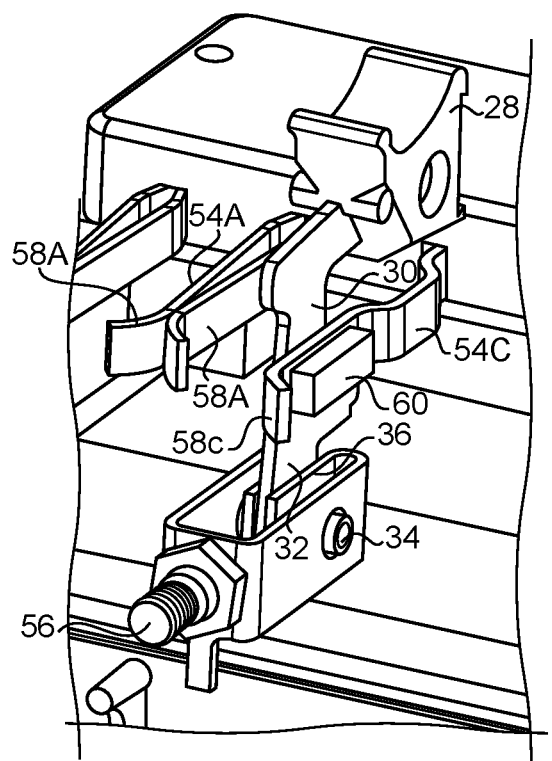

Preferably, the sensing members 54 include one or more spring arms 58 that are biased laterally toward the disconnect switch 26. For example, one or more of the sensing members 54A may have two spring arms 58A biased against each other. When the data collection cover 50 is installed onto the housing 12, the disconnect switch 26 may slide through the opening between the ends of the arms 58A. In this particular sensing member 54A, the arms 58A may be metallic and electrically contact the sides of the disconnect switch 26 when the data collection cover 50 is installed onto the housing 12. This type of sensing member 54A may be used to transmit a voltage to the data collection cover 50. One or more of the sensing members 54B may alternatively surround at least a portion of the disconnect switch 26 without electrically contacting the disconnect switch 26. In this version, the sensing members 54B may be made of a polymer and may have a Rogowski coil embedded within the spring arms 58B. If desired, the end portions of the spring arms 58B may be biased to contact each other, and during installation, the disconnect switch 26 is pressed through the end portions. This type of sensing member 54B may be useful to transmit a value to the data collection cover 50 representing current flow through the disconnect switch 26. As shown in FIG. 11B, one or more of the sensing members 54C may have a single spring arm 58C biased laterally against the disconnect switch 26. In this version, the spring arm 58C may also be made of a polymer. During installation, the spring arm 58C may slide against the side of the disconnect switch 26. It may be desirable to provide a Hall Effect sensor 60 on the spring arm 58C. Thus, this type of sensing member 54C may also be useful to transmit a value representative of a current flowing through the disconnect switch 26 to the data collection cover 50.

Preferably, each of the sensing members 54 engage the movable contacts 30 when the disconnect switch 26 is closed. Even more preferably, the sensing members 54 are positioned to engage the movable contact 30 in the space 62 between the spring contacts 36 around the pivot pin 34 of the movable contact 30 and the spring contacts 40 of the stationary contact 38 (FIG. 8B). Thus, the data collection cover 50 can be used with conventional relay assemblies 24 without modifications to or replacement of the relay assembly 24. During removal of the data collection cover 50 from the housing 12, it is desirable for the disconnect switches 26 to remain closed and electrically connected to the relay assembly 24. However, because the sensing members 54 are biased against the blades 32 of the movable contacts 30, the sensing members 54 will exert an outward force away from the stationary contacts 38 and tend to open the disconnect switches 26 as the data collection cover 50 is removed from the housing 12. Therefore, it is desirable for the bias force of the spring contacts 40 of the stationary contact 38 to be greater than the bias force of the spring arms 58 of the sensing member 54. Thus, the data collection cover 50 may be removed from the housing 12 (and the sensing members 54 disengaged from the movable contacts 30) without electrically disconnecting the disconnect switches 26.

Figure 12A:
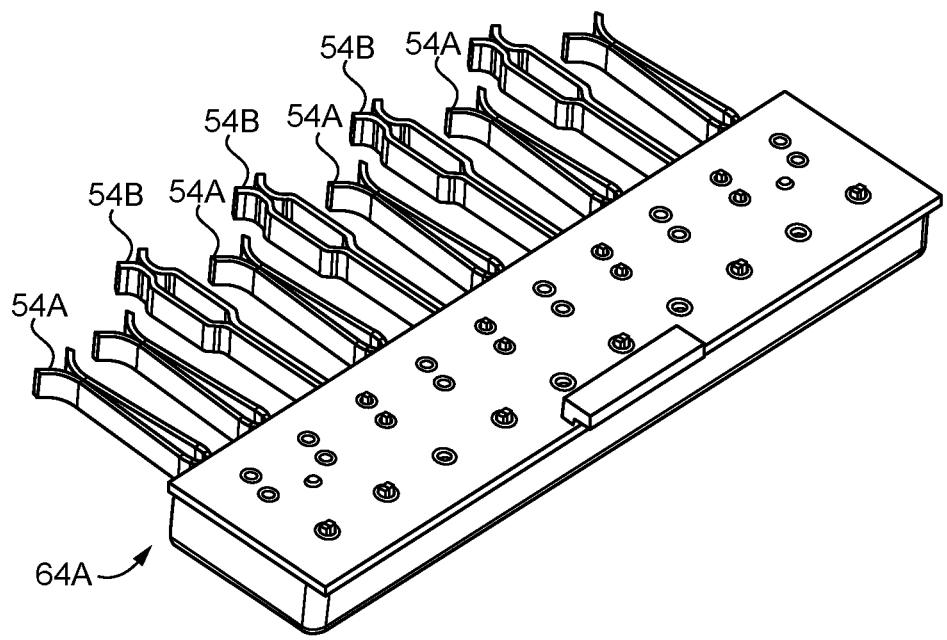
FIGS. 12A-12B are perspective views of sensor modules.
Figure 12B:
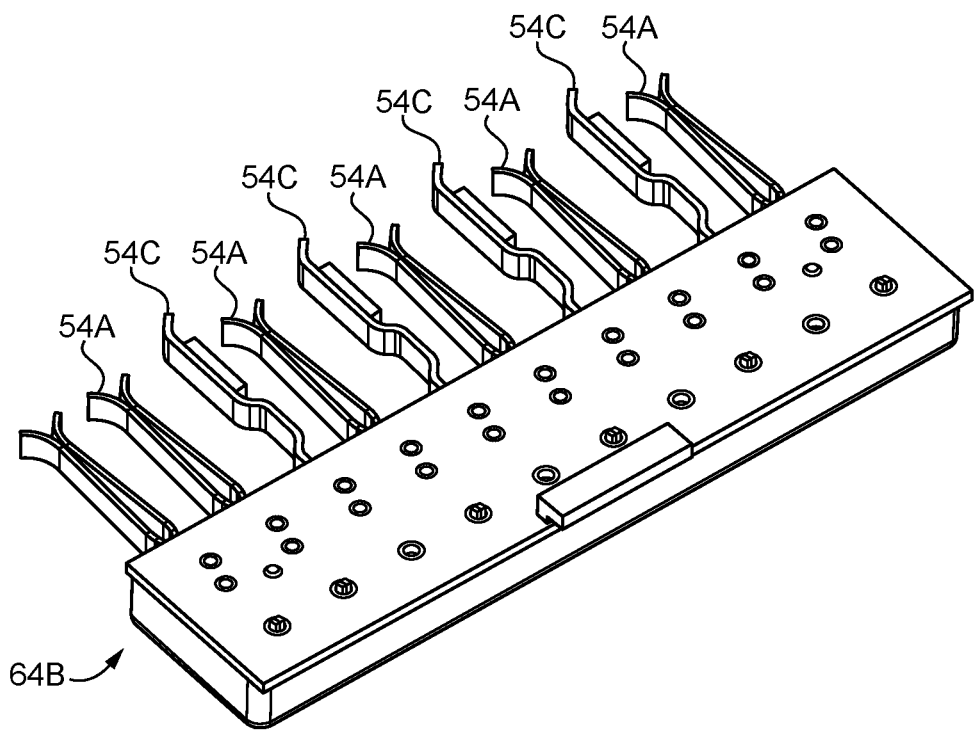

As shown in FIGS. 12A-12B, the sensing members 54 may be connected to a sensor module 64. The sensor modules 64A, 64B preferably provide an interchangeable modular design so that various types of sensor modules 64A, 64B may be manufactured and assembled into a common data collection cover assembly.

Figure 13:
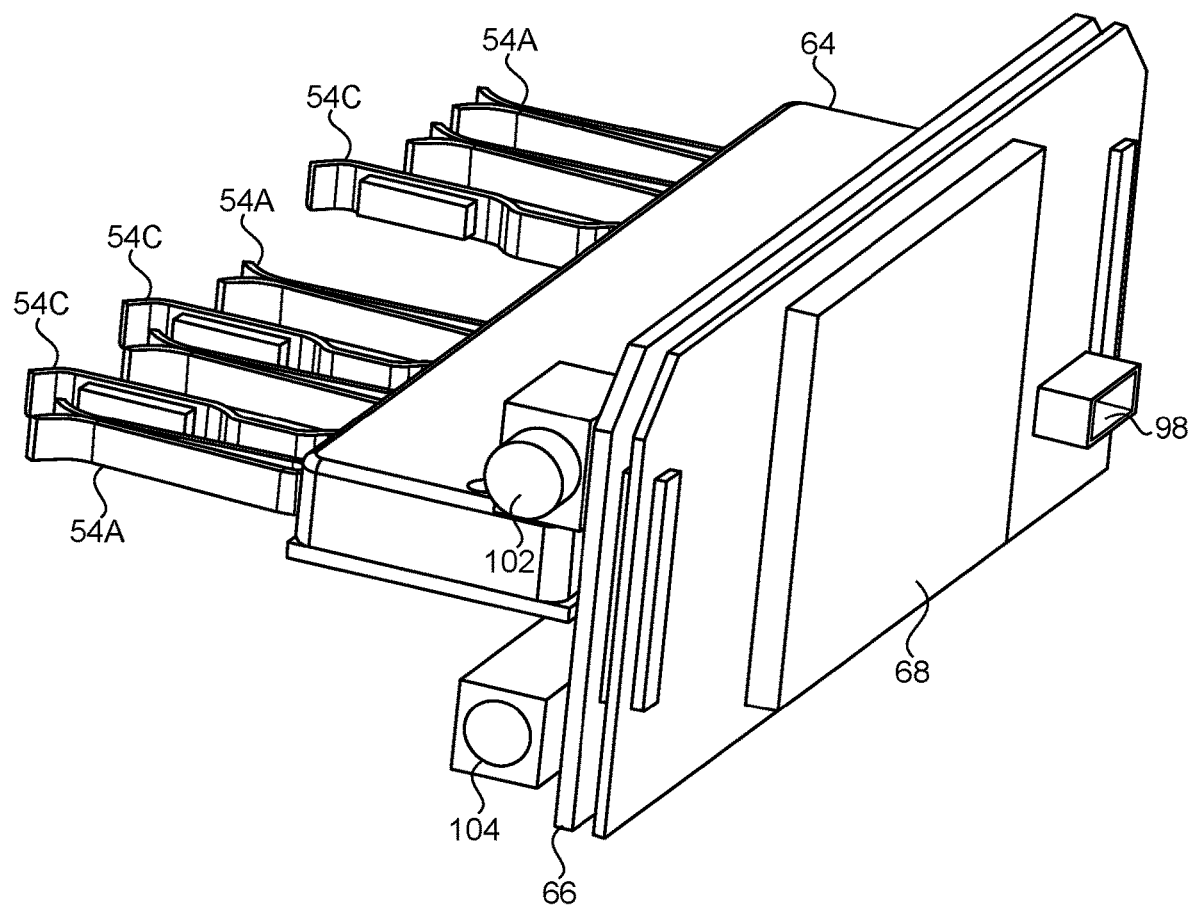
FIG. 13 is a perspective view of the sensing module and a display screen attached to a data processing board.
Figure 14:
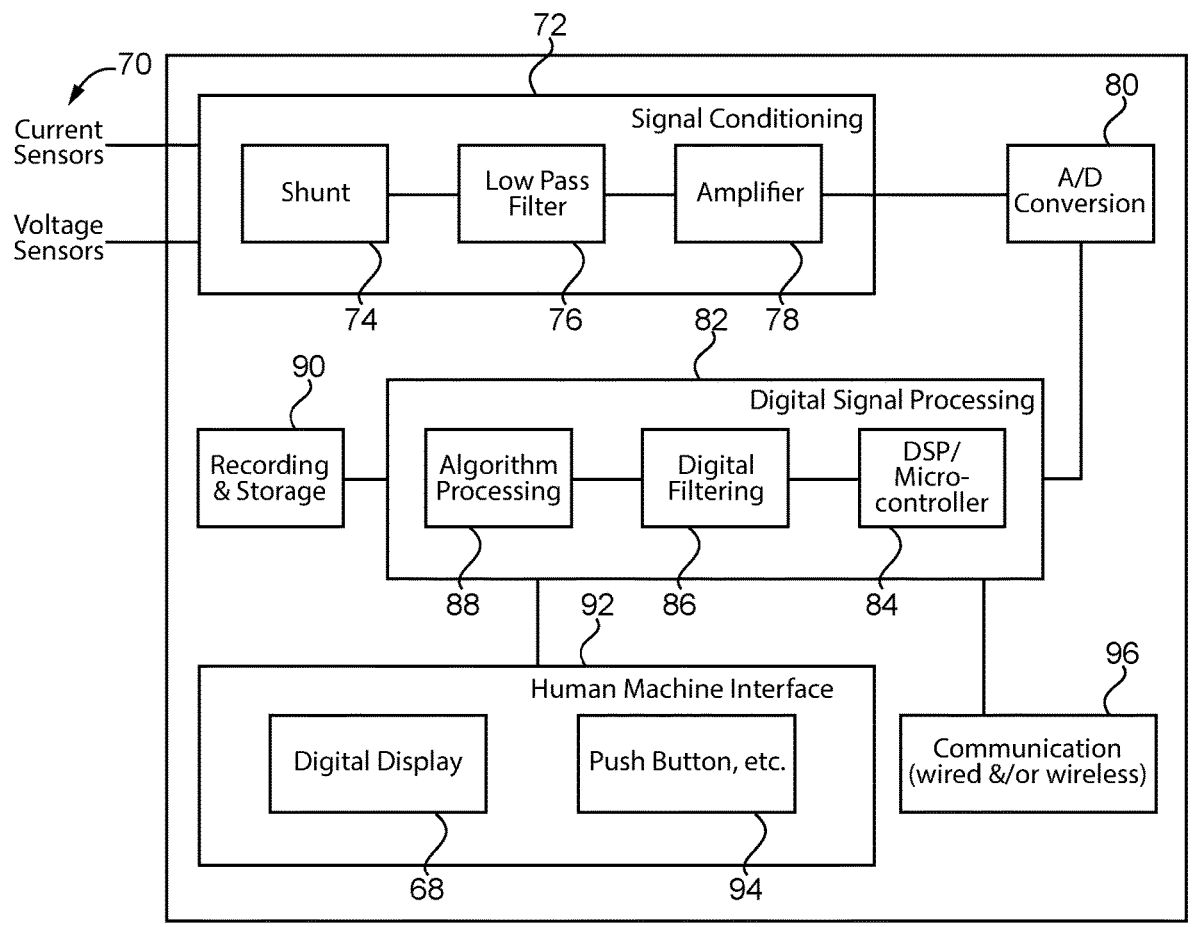
FIG. 14 is a block diagram of electronic components of the data collection cover.
Figure 15A:
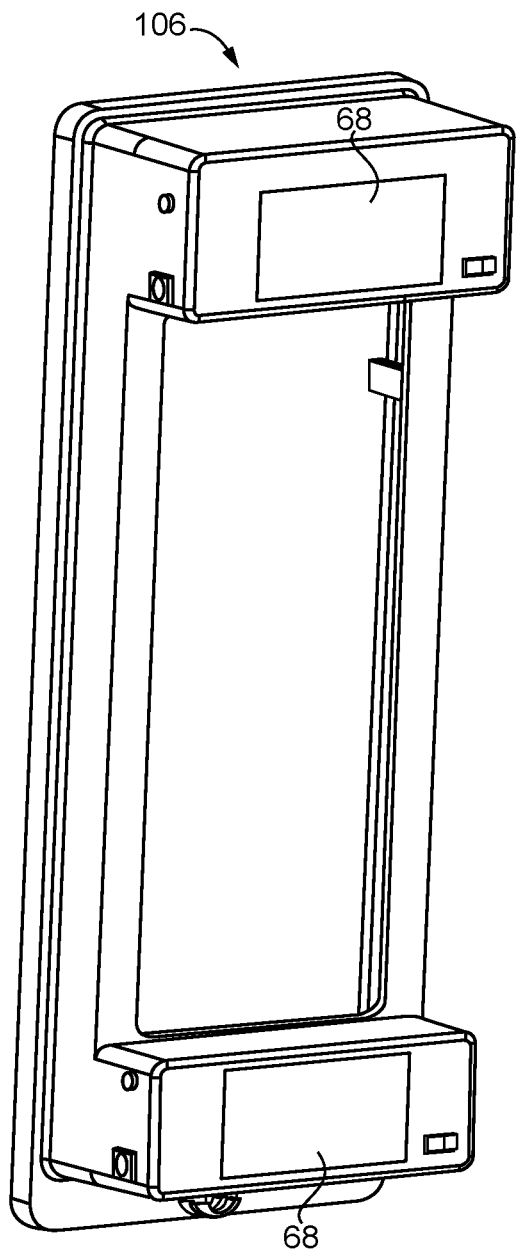
FIGS. 15A-15B are perspective views of an alternative data collection cover.
Figure 15B:
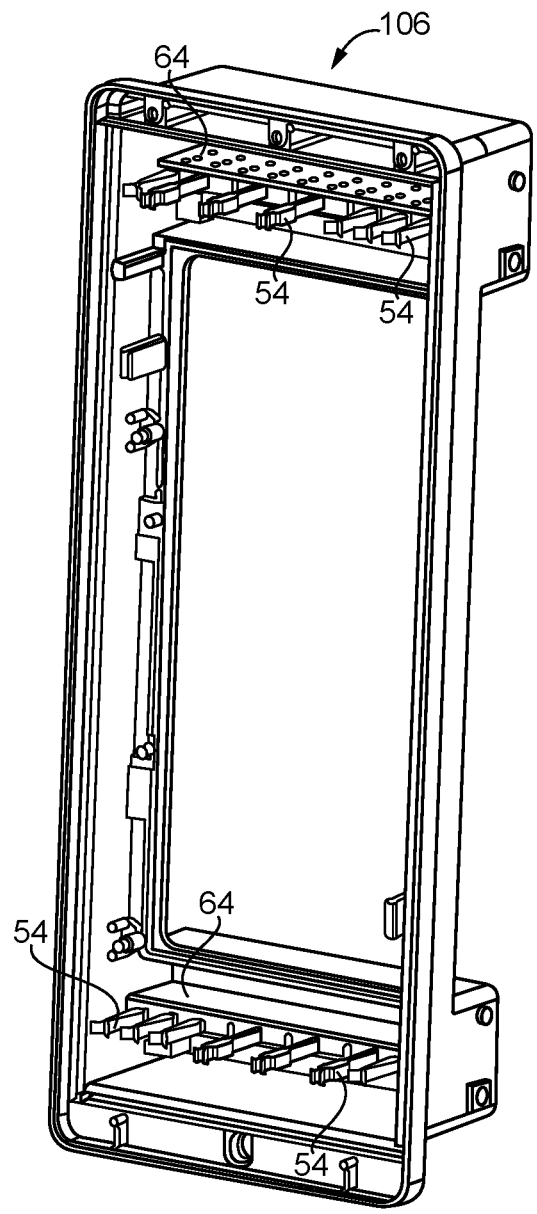

As shown in FIG. 13, the sensor module 64 may be connected to a processing circuit board 66 which includes microprocessors to collect, calculate, store and transmit data collected from the sensing members 54. A display screen 68 may also be connected to the processing circuit board 66. If desired, the display 68 may be a touch screen to receive inputs from the operator. As shown in FIG. 14, analog signals 70 received from the sensing members 54 are preferably initially conditioned with signal conditioning circuits 72, such as a shunt 74, low pass filter 76, and amplifier 78. The conditioned analog signals are then converted to digital signals by an analog-to-digital converter 80. The digital signals may then be processed with controllers 82, such as a DSP/microcontroller 84, digital filters 86, and algorithm processors 88, to convert the raw signals into operator usable data. The processed data may be stored onboard the data collection cover 50 in memory storage 90 for later retrieval from the electromechanical relay 48. An operator may also access the data, either in real time or from the memory storage 90, with a human machine interface 92 including the display screen 68, pushbuttons, etc. 94. The data collection cover 50 may also be provided with communication ports 96, such as wired or wireless ports, to transmit the data to other controllers or data acquisition devices. Communication ports 96 may include a USB port 98 and/or a RJ-45 port 100 (FIG. 9A). The data collection cover 50 may also include a button 102 to turn the data collection cover 50 on and off and to reset the cover 50 (FIG. 8A). A power supply port 104 for connecting an external power supply may also be provided (FIG. 8A). Alternatively, the data collection cover 50 may draw electrical power from one or more of the disconnect switches 26 through the sensing members 54 to power the electronics of the cover 50. As shown in FIGS. 15A-15B, it is also possible to provide the data collection cover 106 in different configurations depending on the type of housing and relay assembly to be used with the cover 106. For example, as shown, the cover 106 may have a large central window 108 with two display screens 68 (and associated processing components) on opposite sides of the cover 106 and a set of sensing members 54 behind each display screen 68.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. An electromechanical relay, comprising:
a housing with a plurality of electrical terminals for connecting electrical conductors to the electromechanical relay, the housing further comprising an opening;
a removable relay assembly disposed within the housing, the removable relay assembly comprising an electromagnetic coil to disconnect and/or connect a pair of electrical contacts, the removable relay assembly being removable from the housing through the opening in the housing;
a plurality of disconnect switches, each of the disconnect switches being manually closable to couple the electrical terminals of the housing with corresponding electrical connections of the removable relay assembly, and the disconnect switches being manually openable to electrically disconnect the removable relay assembly from the housing to allow the removable relay assembly to be removed from the housing, each of the disconnect switches comprising an insulated knob connected to a movable contact, the insulated knob being graspable to manually open and close the disconnect switch;
a data collection cover connected to the housing and enclosing the removable relay assembly within the housing and enclosing the opening in the housing, the data collection cover comprising a plurality of sensing members, each of the sensing members engaging one of the disconnect switches when the disconnect switches are closed and the data collection cover is connected to the housing, and each of the sensing members being disengageable from the disconnect switches when the data collection cover is disconnected from the housing;
wherein the data collection cover comprises an analog-to-digital converter, the analog-to-digital converter receiving an analog signal from the sensing members and converting the analog signal to a digital signal when the removable relay assembly is disposed within the housing and the data collection cover is connected to the housing.

2. The electromechanical relay according to claim 1, wherein each of the sensing members engages the movable contact of the corresponding disconnect switch.

3. The electromechanical relay according to claim 1, wherein the movable contact is pivotally connected to the housing, the movable contact being rotatable away from a stationary contact on the removable relay assembly to open the disconnect switch.

4. The electromechanical relay according to claim 3, wherein each of the sensing members engage the movable contact of the corresponding disconnect switch between the pivotable connection to the housing and the stationary contact of the removable relay assembly.

5. The electromechanical relay according to claim 1, wherein at least one of the sensing members comprises a spring arm biased laterally against the corresponding disconnect switch, such that the spring arm slides against the disconnect switch as the data collection cover is installed onto the housing.

6. The electromechanical relay according to claim 1, wherein at least one of the sensing members comprises two spring arms biased toward each other, the ends of the spring arms extending in toward the opening, such that the disconnect switch slides between spring arms as the data collection cover is installed onto the housing.

7. The electromechanical relay according to claim 1, wherein each of the disconnect switches further comprising a stationary contact, the stationary contact comprises a first spring arm biased laterally against the movable contact, wherein at least one of the sensing members comprises a second spring arm biased laterally against the movable contact of the corresponding disconnect switch, such that the second spring arm slides against the disconnect switch as the data collection cover is installed onto the housing and disconnected therefrom, and wherein a bias force of the first spring arm is greater than the second spring arm such that the second spring arm disengages from the movable contact when the data collection cover is disconnected from the housing without opening the disconnect switch.

8. The electromechanical relay according to claim 1, wherein at least one of the sensing members electrically contacts the corresponding disconnect switch to transmit a voltage to the data collection cover.

9. The electromechanical relay according to claim 1, wherein at least one of the sensing members comprises a Rogowski coil at least partially surrounding the corresponding disconnect switch to transmit a current value to the data collection cover.

10. The electromechanical relay according to claim 1, wherein at least one of the sensing members comprises a Hall Effect sensor engaging the corresponding disconnect switch to transmit a current value to the data collection cover.

11. The electromechanical relay according to claim 1, wherein the data collection cover comprises a controller to process data from the analog-to-digital converter.

12. The electromechanical relay according to claim 1, wherein the data collection cover comprises memory storage to store data from the analog-to-digital converter for later retrieval from the electromechanical relay.

13. The electromechanical relay according to claim 1, wherein the data collection cover comprises a display to output data from the analog-to-digital converter.

14. The electromechanical relay according to claim 1, wherein the data collection cover comprises a communications port to output data from the analog-to-digital converter.

15. The electromechanical relay according to claim 1, wherein each of the sensing members engages the movable contact of the corresponding disconnect switch, the movable contact of each disconnect switch is pivotally connected to the housing, the movable contact being rotatable away from a stationary contact on the removable relay assembly to open the disconnect switch, and each of the sensing members engage the movable contact of the corresponding disconnect switch between the pivotable connection to the housing and the stationary contact of the removable relay assembly.

16. The electromechanical relay according to claim 15, wherein the stationary contact of each disconnect switch comprises a first spring arm biased laterally against the movable contact, at least one of the sensing members comprises a second spring arm biased laterally against the movable contact of the corresponding disconnect switch, such that the second spring arm slides against the disconnect switch as the data collection cover is installed onto the housing and disconnected therefrom, a bias force of the first spring arm is greater than the second spring arm such that the second spring arm disengages from the movable contact when the data collection cover is disconnected from the housing without opening the disconnect switch, at least one of the sensing members electrically contacts the corresponding disconnect switch to transmit a voltage to the data collection cover, and at least one of the sensing members comprises a Rogowski coil at least partially surrounding the corresponding disconnect switch or a Hall Effect sensor engaging the corresponding disconnect switch to transmit a current value to the data collection cover.

17. The electromechanical relay according to claim 16, wherein the data collection cover comprises a controller to process data from the analog-to-digital converter, memory storage to store data from the analog-to-digital converter for later retrieval from the electromechanical relay, a display to output data from the analog-to-digital converter, and a communications port to output data from the analog-to-digital converter.

18. The electromechanical relay according to claim 7, wherein the movable contact is pivotally connected to the housing, the movable contact being rotatable away from a stationary contact on the removable relay assembly to open the disconnect switch.

19. The electromechanical relay according to claim 18, wherein each of the sensing members engage the movable contact of the corresponding disconnect switch between the pivotable connection to the housing and the stationary contact of the removable relay assembly.

* * * * *